(12) United States Patent
Ohyanagi et al.

(10) Patent No.: US 7,663,181 B2
(45) Date of Patent: Feb. 16, 2010

(54) SEMICONDUCTOR DEVICE (75) Inventors: Takasumi Ohyanagi, Hitachinaka (JP);
Atsuo Watanabe, Hitachiota (JP);
Toshio Sakakibara, Nishio (JP);
Tsuyoshi Yamamoto, Kariya (JP);
Hiroki Nakamura, Handa (JP)

(73) Assignees: Hitachi, Ltd., Tokyo (JP); Denso Corporation, Aichi (JP)

( * ) Notice: Subject to any disclaimer, the term of this patent is extended or adjusted under 35 U.S.C. 154(b) by 394 days.

(21) Appl. No.: 11/206,271

(22) Filed: Aug. 18, 2005

(65) Prior Publication Data
US 2006/0071217 A1    Apr. 6, 2006

(30) Foreign Application Priority Data
Oct. 1, 2004   (JP) .............................. 2004-289821

(51) Int. Cl.
*H01L 29/72* (2006.01)
(52) U.S. Cl. ................... 257/328; 257/77; 257/332; 257/368; 257/401
(58) Field of Classification Search ............... 257/77, 257/328, 332, 368, 401
See application file for complete search history.

(56) References Cited
U.S. PATENT DOCUMENTS
4,985,738 A    1/1991  Nishizawa et al.
2003/0178672 A1*   9/2003  Hatakeyama et al. ........ 257/328

FOREIGN PATENT DOCUMENTS
JP    9-508492    8/1997
WO   WO 95/18465   7/1995

OTHER PUBLICATIONS
A.B. Horsfall et al., "Optimisation of a 4H-SiC Enhancement Mode Power JFET", Materials Science Forum vols. 433-436 (2003) pp. 777-780.
Kiyoshi Tone et al., "4H-SiC Normally-Off Vertical Junction Field-Effect Transistor With High Current Density", IEEE Electron Device Letters, vol. 24, No. 7, Jul. 2003.
Office Action dated Jun. 22, 2007; 7 pages.
Translation of an Office Action dated Jun. 22, 2007; 5 pages.

* cited by examiner

*Primary Examiner*—Edward Wojciechowicz
(74) *Attorney, Agent, or Firm*—Antonelli, Terry, Stout & Kraus, LLP.

(57) ABSTRACT

A semiconductor device includes a vertical field-effect transistor having a substrate of first conduction type in a substrate base, a drain electrode formed on a first surface of the substrate, an epitaxial layer of first conduction type formed on a second surface of the substrate, a source region of first conduction type formed on the semiconductor base, a source ohmic contact metal film in ohmic contact with the source region, trenches formed from the second surface of the semiconductor base, and a gate region of second conduction type formed along the trenches. The semiconductor device further includes a gate rise metal film in ohmic contact with the draw-out layer of the gate region on the bottom of the trenches and rising to the second surface of the semiconductor base, and a gate draw-out metal film connected to the gate rise metal film from the second surface of the semiconductor base.

26 Claims, 9 Drawing Sheets

SEMICONDUCTOR DEVICE

CROSS-REFERENCE TO RELATED APPLICATIONS

The present application relates to subject matters described in a co-pending patent application Ser. No. 11/138,298 filed on May 27, 2005 entitled "SEMICONDUCTOR DEVICES" and assigned to the assignees of the present application. The disclosures of this co-pending application are incorporated herein by reference.

BACKGROUND OF THE INVENTION

This invention relates to a semiconductor device, or in particular to a structure of a silicon carbide semiconductor device having a vertical field-effect transistor.

Silicon carbide (SiC) has a breakdown voltage about ten times as high silicon (Si). In the case where silicon carbide is used for the vertical field-effect transistor, therefore, the drift layer (epitaxial layer) for maintaining the withstanding voltage can be reduced in thickness and increased in concentration for a lower loss. One of the power semiconductor devices using SiC is a junction FET (JFET) or a static induction transistor (SIT).

JP-A-9-508492 PCT (Patent Document 1) (FIGS. 6 to 11), Materials Science Forum Vols. 433-436 (2003) pp. 777-780 (Non-Patent Document 1), and IEEE ELECTRON DEVICE LETTERS VOL. 24, NO. 7, JULY 2003, pp. 463-465 (Non-Patent Document 2) disclose a semiconductor device utilizing the properties of SiC. in the semiconductor disclosed in these documents, an $n^+$ substrate and an $n^-$ epi-layer constituting a drain region are formed from a first surface of the SiC semiconductor base, and an $n^+$ source region is formed along a second surface thereof. Deep trenches are formed from the second surface, and a $p^+$ gate region is formed along the trenches. This $p^+$ gate region extends to a position in contact with the $n^+$ source region. Between adjoining trenches, a source electrode is formed through a source contact layer in contact with the surface of the $n^+$ source region existing along the second surface. This source electrode extends not only on the surface of the $n^+$ source region but also, beyond the surface of the insulating material in the trenches, extends over the entire length of the second surface of the semiconductor base. On the other hand, a gate contact layer adjoining the $p^+$ gate region is formed on the bottom of the trenches. These JFET and SIT are transistors for turning on/off the current through the depletion layer expanding to the channels between the $p^+$ gate regions of a pair of adjacent trenches. By minimizing this channel width, what is called a "normally-off" transistor is realized which holds the off state even in the case where the gate voltage is zero.

Non-Patent Document 1 discloses the fact that assuming that the concentration of the n epi-layer constituting a drift layer is $3E15/cm^3$ or $3\times10^5/cm^3$, the channel width is 2.0 μm, the trench depth is 2.0 μm and the gate voltage Vg is 0 V, the withstanding voltage of 650 V and the forward current density of 250 A/cm² can be realized.

SUMMARY OF THE INVENTION

With SiC, the p gate region is formed by ion implantation of aluminum or boron or depositing an epitaxial layer using similar dopants. The gate layer resistance (also called the sheet resistance value), however, is as high as several kΩ to several tens of kΩ and constitutes a stumbling block to the high-speed switching operation.

The object of this invention is to provide a semiconductor device capable of high-speed switching operation, or in particular a semiconductor device suitable as a static induction transistor using silicon carbide.

According to one aspect of the invention, there is provided a semiconductor device having a vertical field-effect transistor formed with trenches, comprising a gate rise metal film in ohmic contact with a gate draw-out layer on the bottom of the trenches and rising to the surface of the semiconductor substrate, and a gate draw-out metal film connected to the gate rise metal film from the surface of the semiconductor base.

According to another preferred aspect of the invention, there is provided a semiconductor device, wherein the field-effect transistor is a normally-off JFET having trenches as described in Patent Document 1 and Non-Patent Documents 1, 2.

A p gate layer formed along the trenches includes a metal film in ohmic contact with the p gate layer under the trenches, and this metal film is raised, for example, to the top of each trench using a CVD (chemical vapor deposition) tungsten plug. In the presence of a source region at the top of the trenches, however, an insulating film is desirably formed so that the CVD tungsten plug is kept out of contact with the side walls of the trenches.

According to still another preferred aspect of the invention, there is provided a semiconductor device, wherein a gate draw-out metal film for connecting the CVD tungsten plugs to each other is formed at the top of the trenches.

The source ohmic contact metal film in ohmic contact with the draw-out layer of the source region is arranged in parallel to the gate ohmic contact metal film formed under the trenches. Therefore, the gate ohmic contact metal films of the lower side portions of the strip of the trenches cannot be connected at the upper portions of the trenches. The source electrode pad for bonding, however, is unavoidably increased in wire thickness to supply a large current in main applications of the SiC device, and the bonding pad is as large as not less than 500 μm square. In the case where the long side of the trench strip is not less than 500 μm similarly to the source electrode pad, therefore, the gate bias is applied only by the two short sides of the trench strip, and therefore the gate delay may pose the problem.

According to yet another preferred aspect of the invention, there is provided a semiconductor device, wherein the long side of the trench strip is shortened and the gate wire is laid in tessellate form. This reduces the width of the source ohmic contact metal film, and therefore the source electrode pad is formed anew.

According to a further preferred aspect of the invention, there is provided a semiconductor device having a vertical field-effect transistor capable of high-speed switching operation, wherein the bias can be applied directly to the gate layer by the gate rise metal film raised to the trenches.

According to a still further preferred aspect of the invention, there is provided a SiC semiconductor device capable of high-speed switching operation, wherein the long side of the trench strip is shortened to eliminate the effects of the gate delay.

The above and other objects, features and advantages will be made apparent by the detailed description taken below in conjunction with the accompanying drawings.

DESCRIPTION OF THE EMBODIMENTS

Embodiments of the invention are described in detail below with reference to the drawings.

Figure 1:
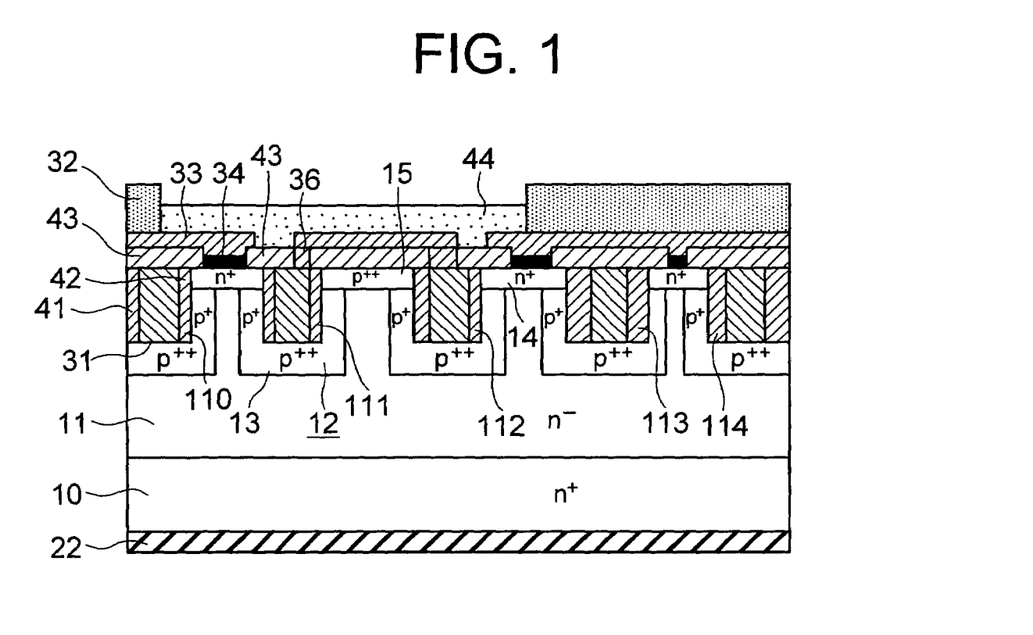
FIG. 1 is a sectional view showing a structure of a SiC semiconductor device according to a first embodiment of the invention.

FIG. 1 is a sectional view showing the structure of a SIT according to an embodiment of the invention. In FIG. 1, a semiconductor base not less than 2.0 eV in bandgap has a substrate 10 of first conduction type $n^+$ (or $p^+$) constituting the drain region and low in impurities concentration. A drain electrode 22 is formed on a first surface of the substrate 10. Also, an epitaxial layer (drift layer) 11 of high resistance having a lower impurities concentration than the substrate 10 of first conduction type is formed on the second surface of the substrate 10. The second surface of the semiconductor base is formed with an $n^+$ source region 14. Here, the first surface of the semiconductor base is the same as the first surface of the substrate 10. The surface of the source region 14 (the second surface of the semiconductor base) is formed with source ohmic contact metal films 34 of nickel to form an ohmic contact. A source draw-out metal film 33 of aluminum is brought into contact with the source ohmic contact metal film 34 thereby to form a source electrode pad 32 of an aluminum metal film. According to this embodiment, a SIT in which a large current of about 400 A/cm$^2$ flows is assumed, and the source electrode pad 32 of aluminum is increased in thickness. Also, the drain electrode 22 is formed of nickel.

A multiplicity of trenches 110 to 114 are formed from the second surface of the semiconductor base, and along these trenches, the $p^+$ gate regions 12 are formed continuously up to the position in contact with the source regions 14. Each gate region 12 has, on the bottom of the trenches, the $p^{++}$ draw-out layers 13 set in high concentration to form an ohmic contact with the gate ohmic contact metal films 31 descried later. In order to connect the $p^+$ gate regions 12 to each other at the upper portion of the trenches, on the other hand, the $p^{++}$ draw-out layers 15 exist.

The gate metal films and the rise metal films 31 connected to the gate metal films and rising to the second surface of the semiconductor are buried in the trenches 110 to 114. According to this embodiment, each portion in contact with the $p^{++}$ gate draw-out layer 13 is formed with a nickel film, while each portion with the trench rising vertically is formed with a tungsten film by CVD. The gate nickel film included in each metal film 13 and in contact with the corresponding $p^{++}$ draw-out layer 13 of the gate region 12 is formed with a silicidation layer by the high-temperature process, so that the $p^{++}$ draw-out layer 13 and the gate nickel film are in ohmic contact with each other. Each metal film 31 connecting the nickel film and the tungsten film makes it possible to rise to the upper portion of the trenches and apply a bias directly to the gate layer. Further, the tungsten films of the gate draw-out metal film 36 formed of aluminum or the like can be connected to each other above the $p^{++}$ gate draw-out layers 15 formed at the upper portion.

As a result, the bias can be applied directly to the gate layer, and the delay due to the gate resistance is minimized. Thus, a SiC semiconductor device capable of high-speed switching operation can be obtained.

Of the gate rise metal films 31 and the insulating films 41, 42, the insulating films 41, 42 of a silicon oxide film or the like buried along the trenches to avoid the contact with the side walls of the trenches. Also, at the upper portion of each trench, the gate and the source are isolated from each other by a layer insulating film 43 of silicon oxide or the like. Further, the layer insulating film 44, which is required to be deposited on a metal film, is preferably a silicon oxide film or a silicon nitride film formed by the plasma CVD process.

Figure 2:
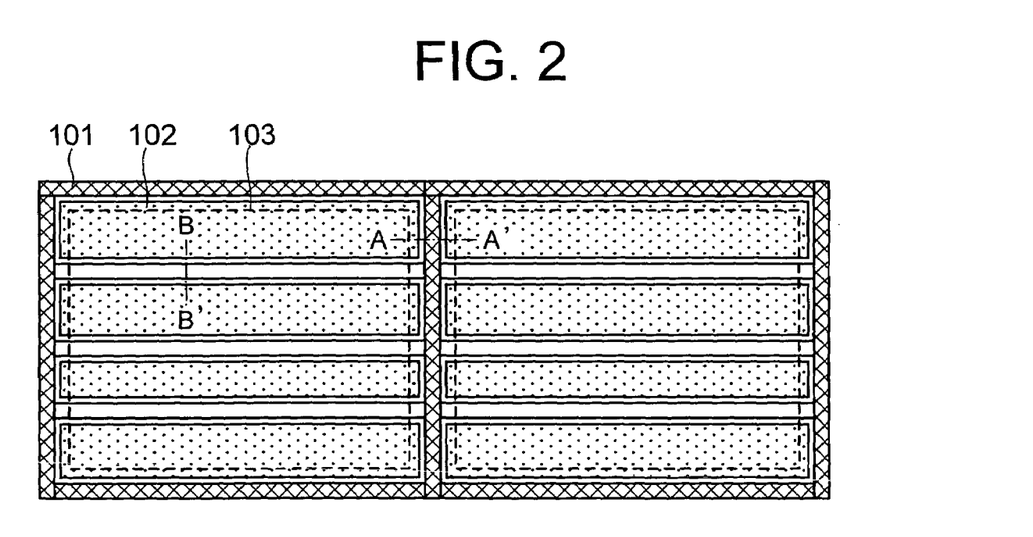
FIG. 2 shows a mask pattern for fabricating a SiC semiconductor device according to the first embodiment of the invention and a layout showing the relation between the source electrode and the gate electrode located under the source electrode pad.

FIG. 2 shows the relation of connection between the source electrode and the gate electrode in the mask layout pattern for fabrication according to the first embodiment of the invention. In the description that follows, the source electrode and the gate electrode are defined as the ohmic contact metal film for leading the source electrode and the gate electrode from the semiconductor base and/or the portion of the metal film for drawing out the source and the gate toward the electrode from the ohmic contact metal film.

Figure 3:
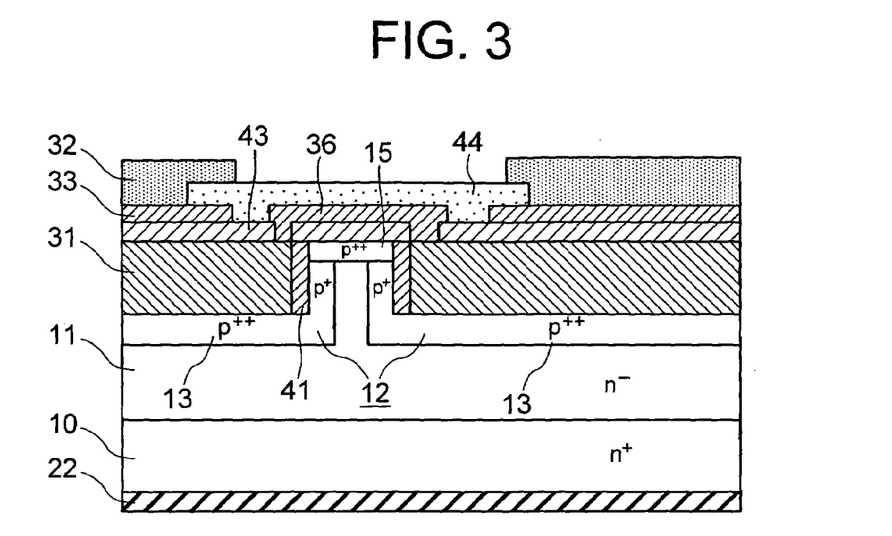
FIG. 3 is a sectional view taken in line B-B' in FIG. 2 showing the SiC semiconductor device according to the first embodiment of the invention.

Reference numeral 101 designates a gate electrode mask pattern, which is subjected to the photolithography process and the electrode process to leave the electrode in the hatched portion. Numeral 102 designates a source electrode 1 subjected to the photolithography process and the electrode process to leave the electrode in the hatched portion. Numeral 103 designates a source electrode 2 subjected to the photolithography process and the electrode process to leave the electrode in the area defined by the dotted line. The mask pattern 101 of the gate electrode and the mask pattern 102 of the source electrode 1 may be formed by the same mask without any problem. Also, the mask pattern 103 of the source electrode 2 is subjected to the photolithography process after the pattern 102. In FIG. 2, the sectional view taken in line A-A' corresponds to the sectional view of the structure shown in FIG. 1, and the sectional view taken in line B-B' corresponds to FIG. 3.

The source electrode 103 normally provides a bonding pad. The SiC semiconductor device according to this embodiment assumes that a large current is supplied, and employs a thick wire for bonding and a bonding pad as large as at least 500 μm square. In the case where the gate wiring is formed only outside the 500 μm square or more, however, the gate bias is applied from the short side of the trench strip. The resulting distance of at least 250 μm to the center of the long side of the strip is liable to cause a gate delay. In view of this, according to this embodiment, the long side of the gate strip is shorter than 100 μm at most, or preferably about 10 to 25 μm, with the gate wire laid in tessellate form. As a result, the gate delay is minimized and a SiC semiconductor device capable of high-speed switching operation is produced.

Figure 4:
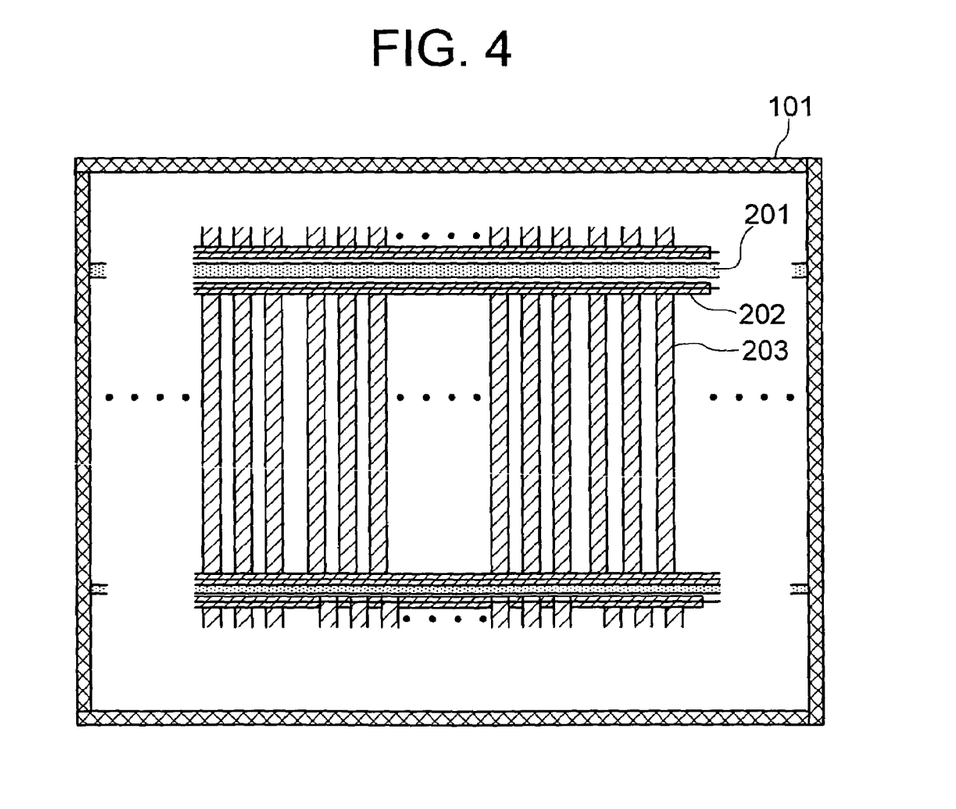
FIG. 4 shows a mask pattern for fabricating a SiC semiconductor device according to the first embodiment of the invention and a pattern located under the source electrode of FIG. 2, which is a layout showing the relation between the mask for forming the trenches, the mask for forming the source region and the gate electrode.

FIG. 4 shows a mask pattern existing under the source electrode 102 in FIG. 2. In FIG. 4, numeral 101 designates the same component part, i.e. the gate electrode, as numeral 101 in FIG. 2. Numeral 201 designates a pattern of the trenches, and specific trenches are indicated by hatches. Numeral 202 designates an area to form a source region or a pattern in which impurities ions are contained within the area defined by solid line at the time of ion implantation. Numeral 203 designates gate electrodes.

The gate electrodes 203 are inserted to such an extent as not to lengthen the long side of the trenches. As a result, the gate delay is reduced and the high-speed switching operation is made possible.

The embodiment described is summarized as follows. First, the semiconductor device according to this embodiment comprises a substrate 10 of first conduction type n (or p) having a high impurities concentration making up a semiconductor base 2.0 eV or more in bandgap, a drain electrode 22 formed on the first surface of the substrate, and an epitaxial layer 11 formed on the second surface of the substrate 10 and having a higher resistance than the substrate of first conduction type. Also, a source region 14 of first conduction type is formed along the second surface of the semiconductor base, a plurality of trenches 110 to 114 are formed from the second surface of the semiconductor base, and a gate region 12 of second conduction type p (or n) is formed along the trenches. This embodiment is thus intended as a SiC semiconductor device comprising a vertical field-effect transistor including the source ohmic contact metal films 34 in ohmic contact with the second surface of the source region 14 and the source draw-out metal film 33 in contact with the source ohmic contact metal films 34.

On the bottom of the trenches 110 to 114, the gate rise metal films 31 in ohmic contact with the gate draw-out layers 13 rise to the second surface of the semiconductor base, and the gate draw-out metal film 36 is connected to the corresponding gate rise metal film 31 from the second surface of the semiconductor base.

The rise metal films 31 form a silicide layer with the gate draw-out layers 13 on the bottom of the trenches, and insulating films 41, 42 including polysilicon are buried between the gate rise metal films 31 and the trenches 110 to 114.

Also, the source draw-out metal film 33 is connected to the source ohmic contact metal film 34. The source draw-out metal films 33 are arranged on the same plane as the gate draw-out metal films 36, and the source electrode pad 32 connected to the corresponding source draw-out metal film 33 is arranged on a plane outside the gate draw-out metal film 36.

Further, a plurality of the source draw-out metal film 33 are arranged on the same plane, and the gate draw-out metal film 36 is always arranged between each adjacent ones of the source draw-out metal films 33.

According to this embodiment, the gate delay is minimized, and a SiC semiconductor device capable of high-speed switching operation is provided.

Figure 5:
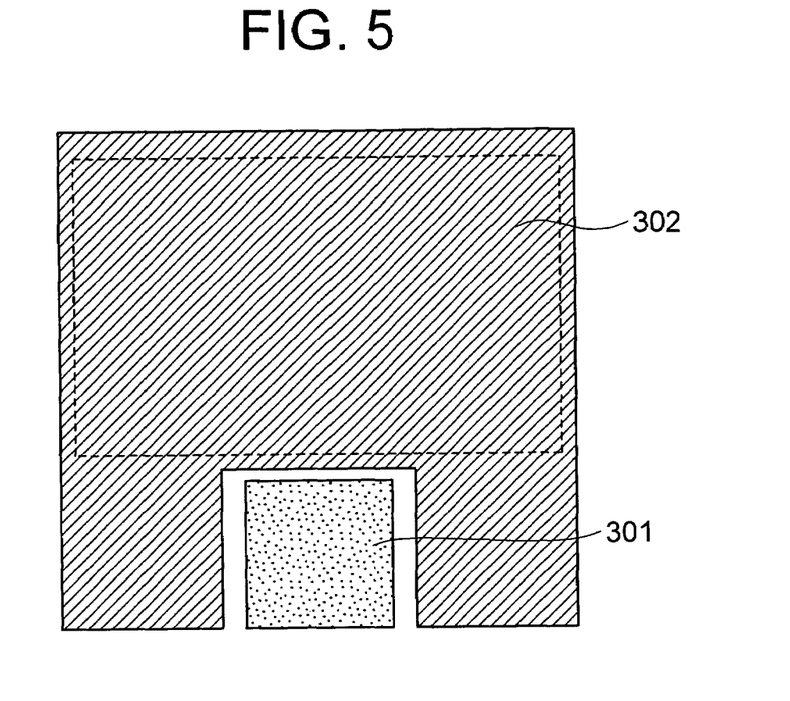
FIG. 5 is a diagram showing the relation between the source pad, the gate electrode and the gate electrode pad in the mask pattern for fabricating the SiC semiconductor device according to a first embodiment of the invention.
Figure 6:
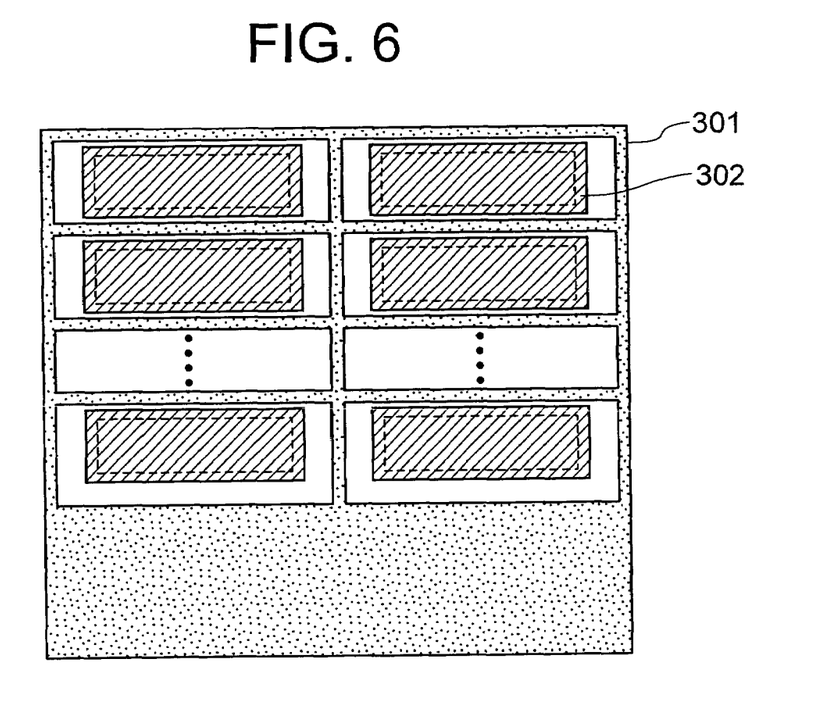
FIG. 6 is a diagram showing the relation between the source pad, the gate electrode and the gate electrode pad in the mask pattern for fabricating the SiC semiconductor device according to a second embodiment of the invention.
Figure 7:
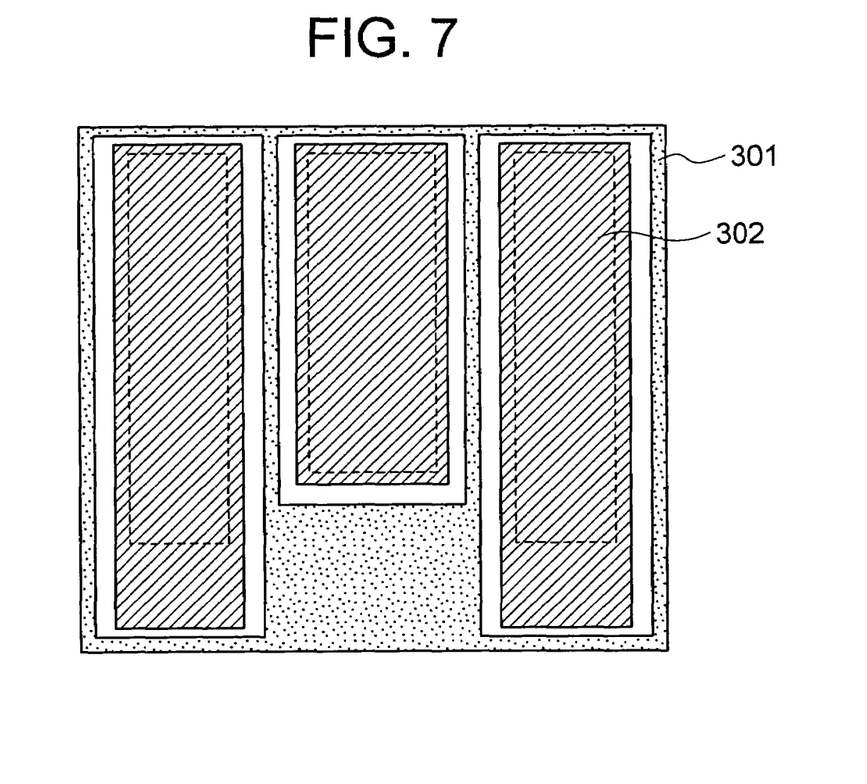
FIG. 7 is a diagram showing the relation between the source pad, the gate electrode and the gate electrode pad in the mask pattern for fabricating the SiC semiconductor device according to a third embodiment of the invention.

FIGS. 5 to 7 show the relation between the source pad, the gate electrode and the gate electrode pad in the first to third mask patterns for fabricating a SiC semiconductor device according to an embodiment of the invention. Numeral 301 designates a gate electrode and a gate pad associated with the gate electrode, and numeral 302 source electrode pads. The pattern shown in FIG. 2 is arranged under the source electrode pad.

FIGS. 8A to 8K are sectional views of a structure showing the fabrication steps A to K of a semiconductor device according to the first embodiment of the invention.

Figure 8A:
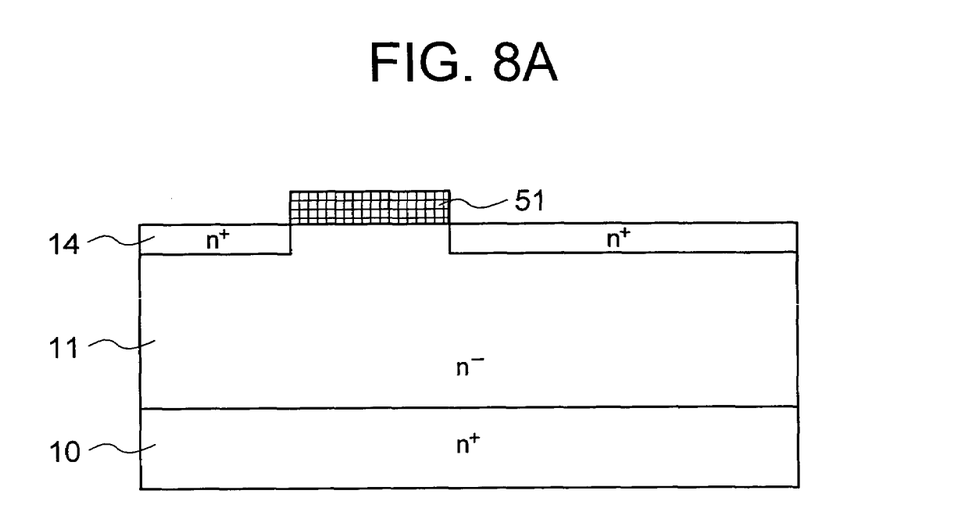
FIG. 8A is a sectional view of the structure showing the fabrication step A of a semiconductor device according to the first embodiment of the invention.

First, as shown in FIG. 8A, a mask 51 is formed of a photoresist, for example, on the SiC substrate 10 having a n⁻ epi-layer 11, and a n⁺ layer 14 is selectively formed by implantation of nitrogen or phosphor ions.

Figure 8B:
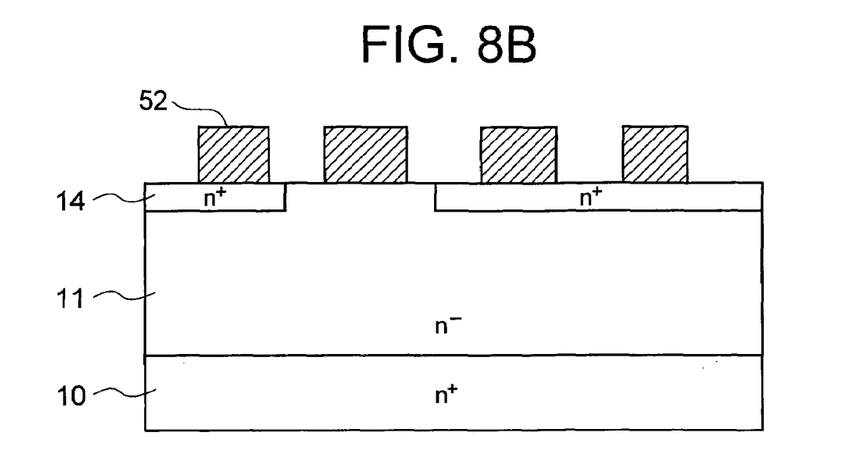
FIG. 8B is a sectional view of the structure showing the fabrication step B of a semiconductor device according to the first embodiment of the invention.
Figure 8C:
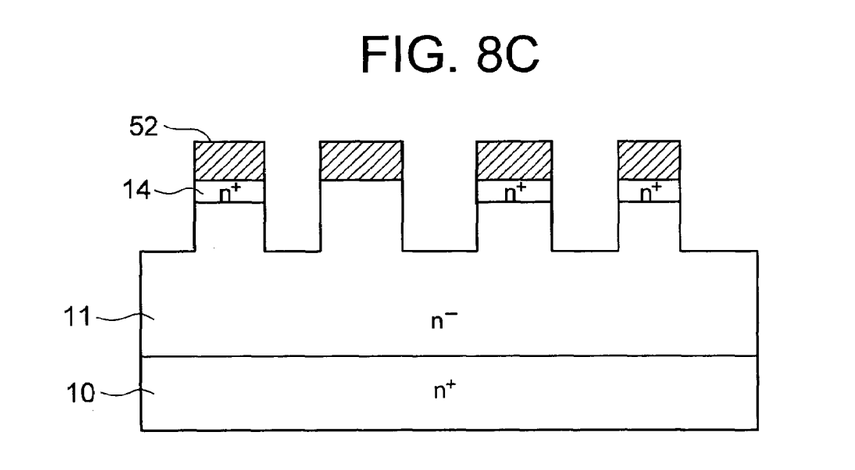
FIG. 8C is a sectional view of the structure showing the fabrication step C of a semiconductor device according to the first embodiment of the invention.

Next, as shown in FIG. 8B, a mask 52 is formed by patterning a photoresist or a CVD silicon oxide film, and as shown in FIG. 8C, the trenches are formed in the SiC epi-layer 11 by the mask 52.

Figure 8D:
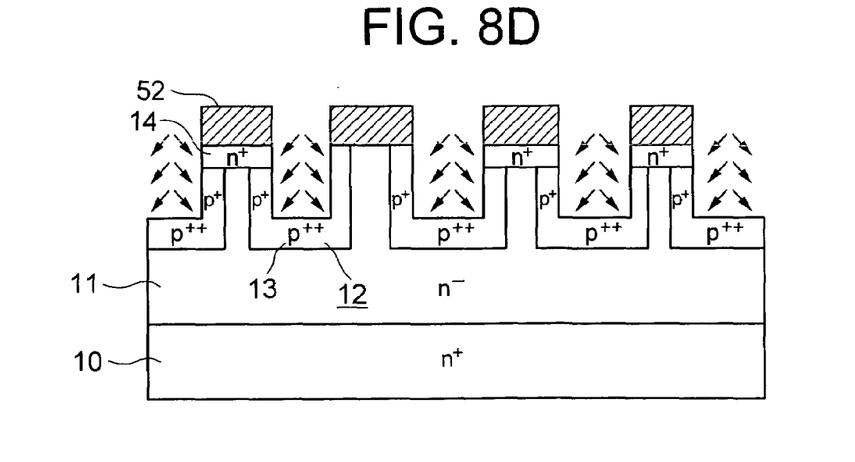
FIG. 8D is a sectional view of the structure showing the fabrication step D of a semiconductor device according to the first embodiment of the invention.

As shown in FIG. 8D, with the mask 52 kept attached, p⁺ gate regions 12 and p⁺⁺ gate draw-out layers 13 are formed by aluminum ion implantation. The p⁺ gate regions 12 are suitably formed by an oblique ion implantation.

Figure 8E:
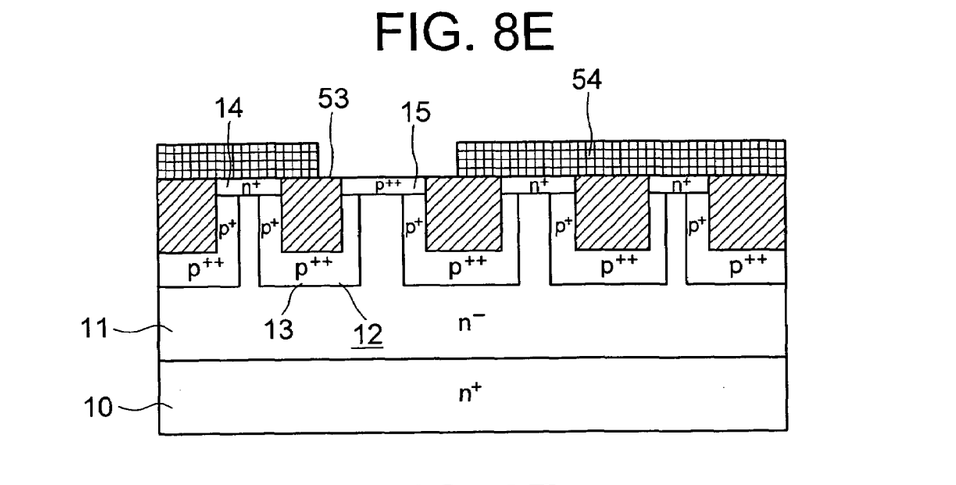
FIG. 8E is a sectional view of the structure showing the fabrication step E of a semiconductor device according to the first embodiment of the invention.

Next, as shown in FIG. 8E, each trench is buried with a CVD silicon oxide film 53 or the like and masked by a photoresist 54 or the like. Then, the p⁺⁺ gate draw-out layer 15 of high concentration is formed by aluminum ion implantation.

Figure 8F:
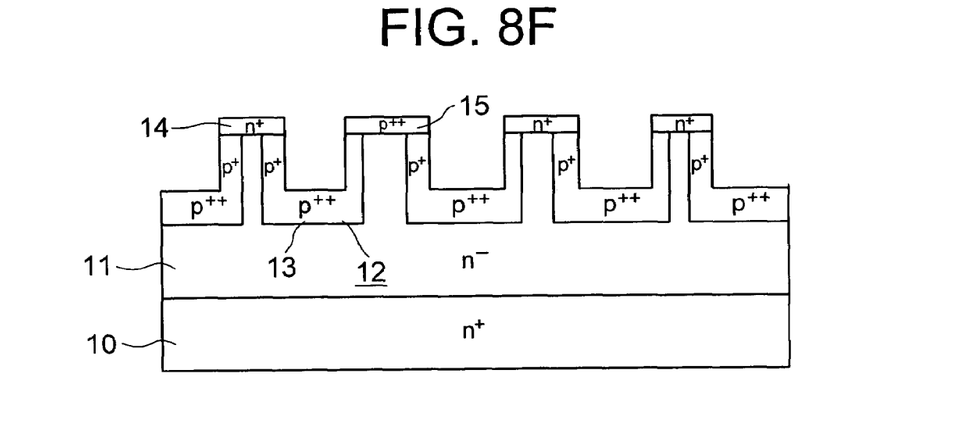
FIG. 8F is a sectional view of the structure showing the fabrication step F of a semiconductor device according to the first embodiment of the invention.

After removing the CVD oxide films and the photoresist entirely as shown in FIG. 8F, the annealing is conducted at a temperature as high as about 1500 to 2000° C. Thus, the defects caused by ion implantation are removed while at the same time activating the dopants injected.

Figure 8G:
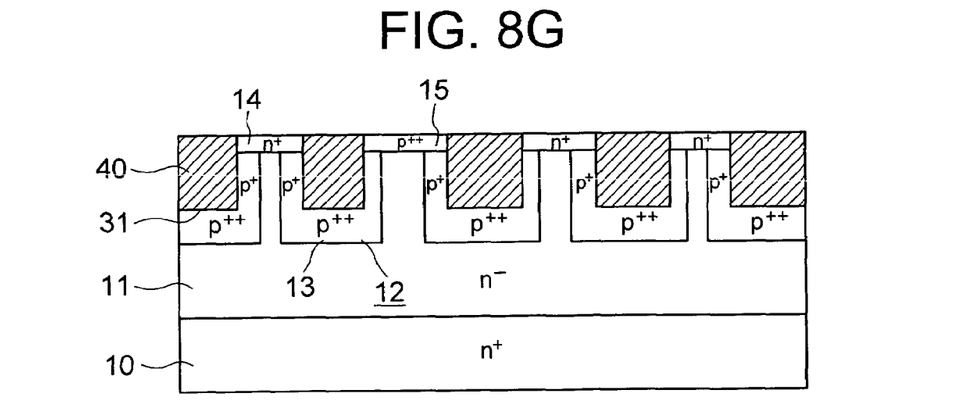
FIG. 8G is a sectional view of the structure showing the fabrication step G of a semiconductor device according to the first embodiment of the invention.

Next, as shown in FIG. 8G, the trenches are each buried with a CVD silicon oxide film 40 or the like.

Figure 8H:
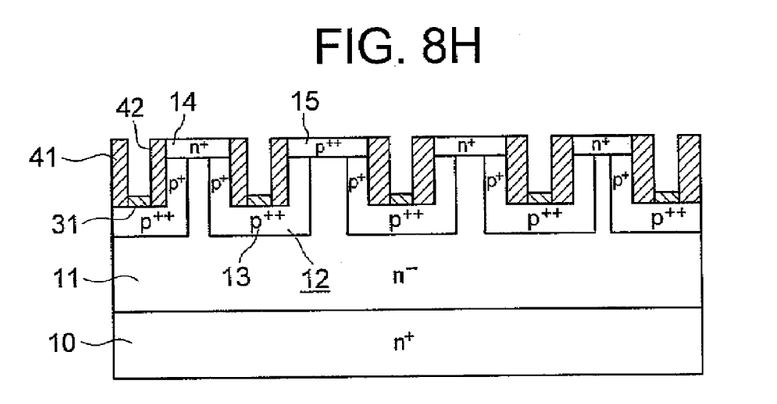
FIG. 8H is a sectional view of the structure showing the fabrication step H of a semiconductor device according to the first embodiment of the invention.

Further, as shown in FIG. 8H, the buried CVD silicon oxide film is formed with a hole by drying etching or the like, so that each CVD silicon oxide film 40 is divided into insulating films 41, 42 along the left and right wall surfaces of the trench shown in FIG. 8H. A metal film 31 of nickel or the like is deposited by evaporation on the bottom surface of each trench. After depositing nickel or the like by evaporation on the reverse surface, the annealing is conducted at about 1000° C. Thus, a silicidation layer is formed between the $p^{++}$ layer and nickel thereby to form an ohmic contact.

Figure 8I:
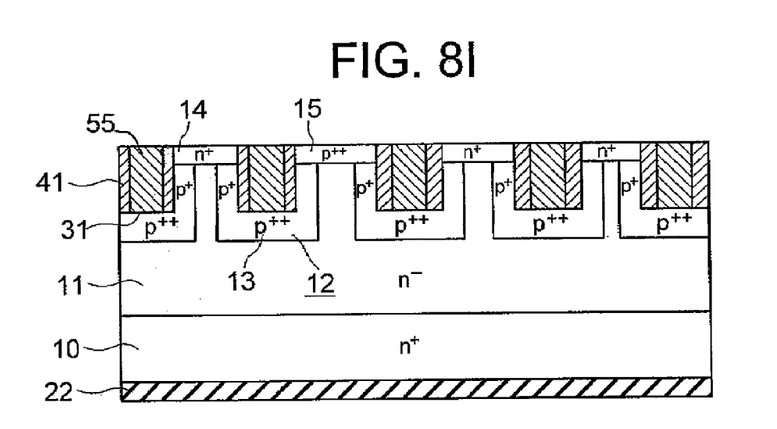
FIG. 8I is a sectional view of the structure showing the fabrication step I of a semiconductor device according to the first embodiment of the invention.

As shown in FIG. 8I, a tungsten film 55 is deposited in the holes using the CVD tungsten.

Figure 8J:
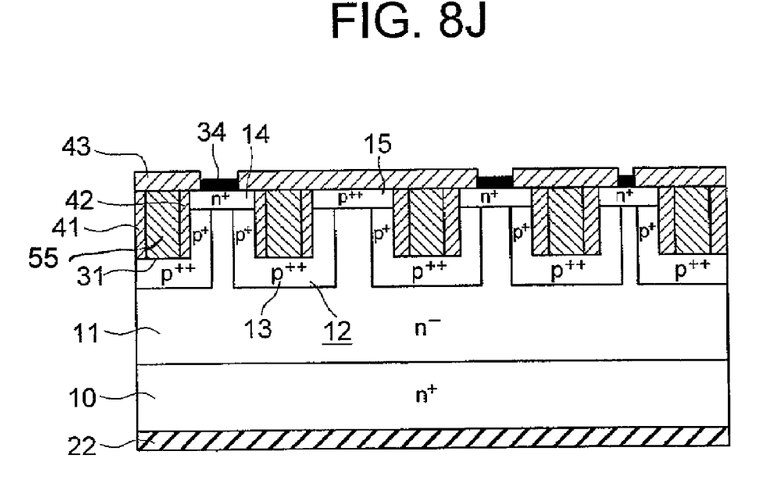
FIG. 8J is a sectional view of the structure showing the fabrication step J of a semiconductor device according to the first embodiment of the invention.

Next, as shown in FIG. 8J, a CVD silicon oxide film 43 or the like is deposited by the plasma method, after which a contact hole is formed, and a nickel film 34 is deposited by evaporation, followed by patterning.

Figure 8K:
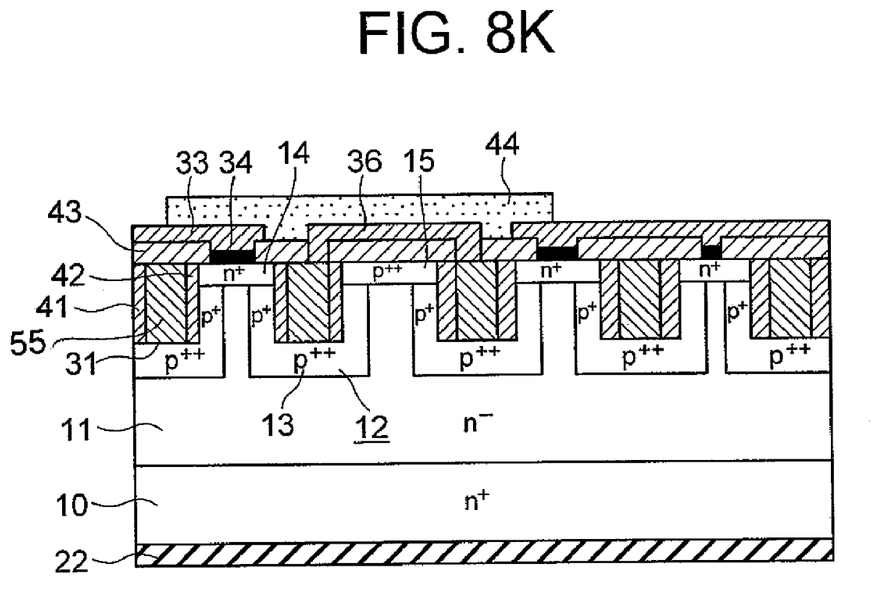
FIG. 8K is a sectional view of the structure showing the fabrication step K of a semiconductor device according to the first embodiment of the invention.

As shown in FIG. 8K, after depositing the aluminum film 33 by evaporation, the patterning is conducted. After further depositing the CVD silicon oxide film 44 by the plasma method, the pad portion is formed with a hole, aluminum or the like is deposited by evaporation, followed by patterning. In this way, a SiC semiconductor device shown in FIG. 1 is produced.

Figure 9A:
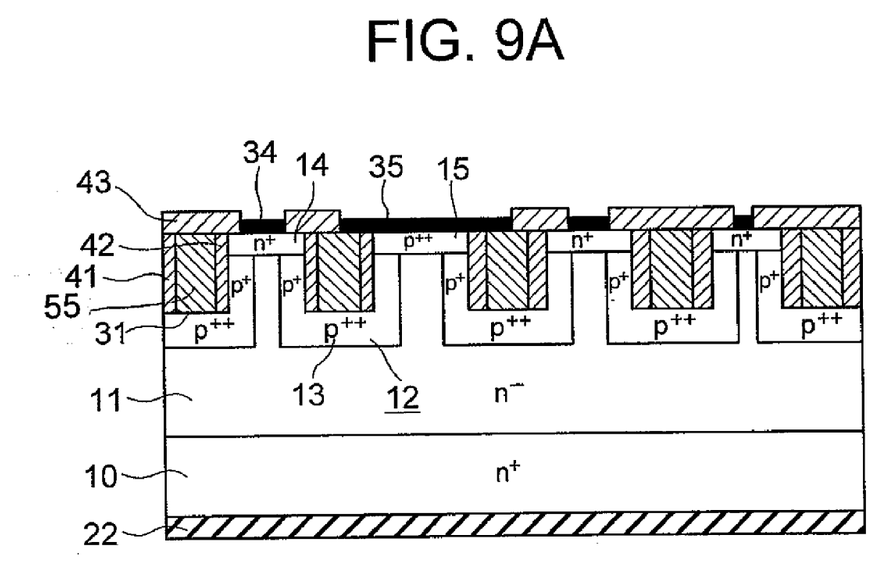
FIG. 9A is a sectional view of the structure showing the fabrication step J of a semiconductor device according to the second embodiment of the invention.
Figure 9B:
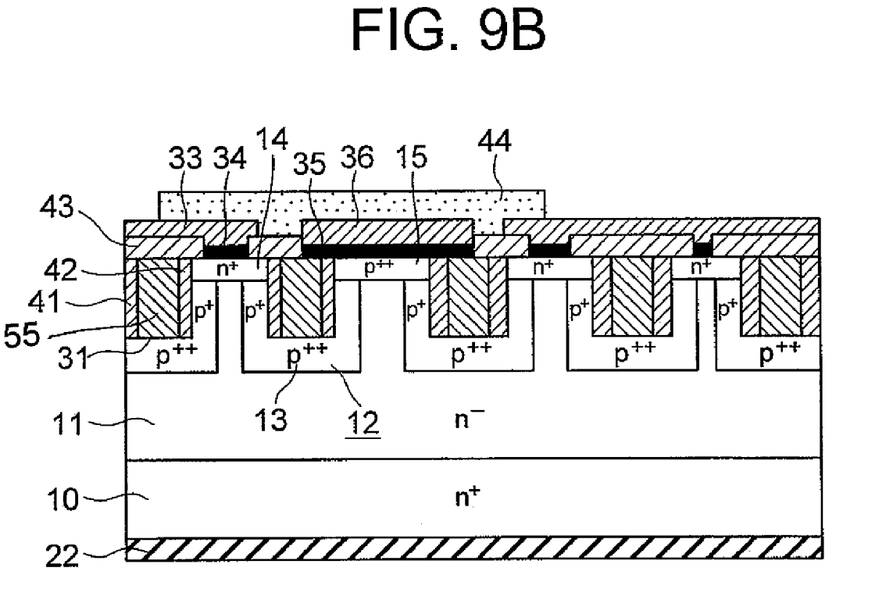
FIG. 9B is a sectional view of the structure showing the fabrication step K of a semiconductor device according to the second embodiment of the invention.
Figure 9C:
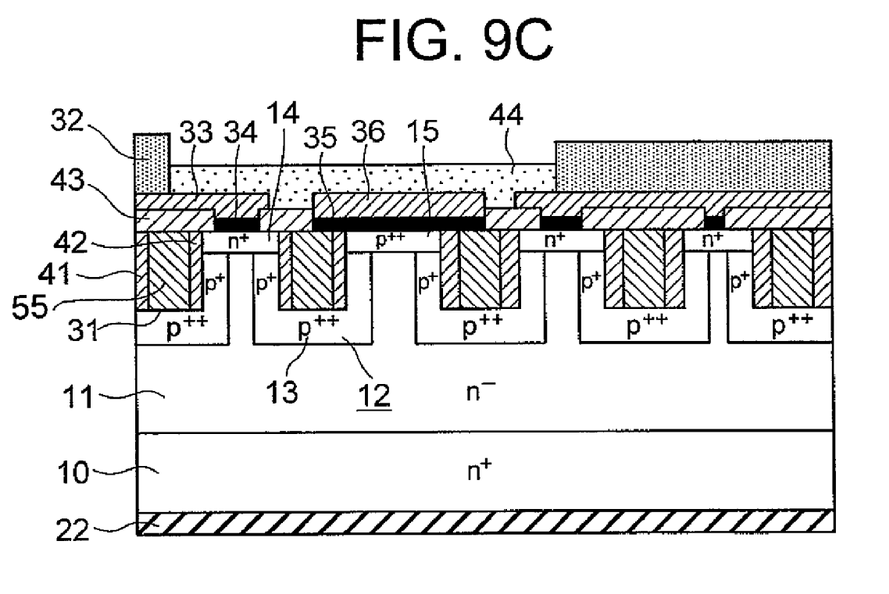
FIG. 9C is a sectional view of the structure showing the fabrication step L of a semiconductor device according to the second embodiment of the invention.

FIGS. 9A to 9C are sectional views of a structure showing the fabrication steps J to L of the semiconductor device according to a second embodiment of the invention.

According to the second embodiment, the preceding fabrication steps A to I followed by the steps J to L are identical to the steps shown in FIGS. 8A to 8I.

Next, as shown in FIG. 9A, the CVD silicon oxide films 43 or the like are deposited by the plasma method, after which each contact hole is formed and each source ohmic contact metal film such as a nickel film 34 is formed by vapor deposition. At the same time, a nickel film is deposited by evaporation as a gate ohmic contact metal film 35 and patterned on the high-concentration p draw-out layer 15 in the p gate region.

As shown in FIG. 9B, after depositing the aluminum films 33, 36 by evaporation, the patterning is conducted and the CVD silicon oxide film 44 is deposited by the plasma method.

Finally, the pad 32 is formed with a hole and aluminum or the like is deposited by evaporation for patterning. Thus, a SiC semiconductor device as shown in FIG. 9C is produced.

The embodiments described above are summarized as follows. First, a semiconductor device comprises the substrate 10 of first conduction type n (or p) having a low impurities concentration as a semiconductor base having the bandgap of at least 2.0 eV, the drain electrode 22 formed on a first surface of the substrate, and an epitaxial layer 11 formed on the second surface of the substrate 10 and lower in resistance than the substrate of first conduction type. Along the second surface of the semiconductor base, the source region 14 of first conduction type is formed. A plurality of trenches 110 to 114 are formed from the second surface of the semiconductor base. A gate region 12 of second conduction type p (or n) is formed along each of the trenches. A SiC semiconductor device having a vertical field-effect transistor is thus provided, comprising a source ohmic contact metal film 34 in ohmic contact with the second surface of the source region 14 and a source draw-out metal film 33 in contact with the source ohmic contact metal film 34.

On the bottom of the trenches 110 to 114, a gate rise metal film 31 in ohmic contact with a corresponding gate draw-out layer 13 and rising to the second surface of the semiconductor base is formed as in the first embodiment.

This embodiment is different, however, from the first embodiment described above in that the gate ohmic contact metal film 35 in contact with the gate rise metal film 31 rises from the second surface of the semiconductor base. This gate ohmic contact metal film 35 is connected with the gate draw-out metal film 36. In this way, the nickel films and the tungsten films are connected to rise to the upper portion of the trenches, thereby further reducing the resistance, while at the same time making it possible to connect the tungsten films to each other by the $p^{++}$ gate draw-out layer 15 at the upper portion. The connection of the tungsten films on the $p^{++}$ gate draw-out layer 15 minimizes the delay in the gate resistance due to the assumption that the length of the long side of the trench strip is 10 μm to 100 μm, thereby providing a SiC semiconductor device capable of high-speed switching operation.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising a vertical field-effect transistor, said vertical field-effect transistor having:
   a semiconductor base substrate which includes a substrate of first conduction type, an epitaxial layer of first conduction type formed on a second surface of the substrate, and a plurality of trenches formed in said epitaxial layer;
   a drain electrode formed on a first surface of the substrate;
   a source region of first conduction type formed on the semiconductor base along the second surface;
   a source ohmic contact metal film in ohmic contact with the source region;
   a gate region of second conduction type formed along the trenches; and
   a gate ohmic contact metal film having a bottom surface for ohmic contacting with the gate region on the bottom of the trenches,
   said semiconductor device further comprising:
   a gate rise metal film in contact with an upper surface said gate ohmic contact metal film on the bottom of the trenches and rising to the second surface of the semiconductor base substrate to provide an upper surface of the gate rise metal film at said second surface of the semiconductor base substrate; and
   a gate draw-out metal film connected to the gate rise metal film from the second surface of the semiconductor base substrate, wherein a portion of the gate draw-out metal film is formed on said upper surface of the gate rise metal film; and
   a source draw-out metal film coupled to said source ohmic contact metal film,
   wherein said source draw-out metal film and said gate draw-out metal film are arranged on a same plane.

2. A semiconductor device according to claim 1, wherein an insulating film is buried between the gate rise metal film and wall surfaces of the trenches.

3. A semiconductor device according to claim 1, wherein an insulating film including a silicon oxide film is buried between the gate rise metal film and wall surfaces of the trenches.

4. A semiconductor device according to claim 1, wherein the gate rise metal film forms a silicide layer with the gate ohmic contact metal film on the bottom of the trenches.

5. A semiconductor device according to claim 1,
wherein a plurality of source draw-out metal films are arranged on the same plane, and the gate draw-out metal film is arranged between the plurality of the source draw-out metal films.

6. A semiconductor device according to claim 1,
wherein a source electrode pad connected to the source draw-out metal film is arranged on the plane outside of the gate draw-out metal film.

7. The semiconductor device according to claim 1, wherein the upper surface of the gate rise metal film is substantially level with the second surface of the semiconductor base substrate so that the upper surface of the gate rise metal film and the second surface of the semiconductor base substrate form a substantially flat surface.

8. The semiconductor device according to claim 1, wherein said portion of the gate draw-out metal film is in direct contact with the upper surface of the gate rise metal film.

9. The semiconductor device according to claim 7, wherein said portion of the gate draw-out metal film is in direct contact with the upper surface of the gate rise metal film.

10. A silicon carbide semiconductor device comprising a vertical field-effect transistor, said vertical field-effect transistor having:
a semiconductor base substrate having a bandgap of not less than 2.0 eV, which includes a silicon carbide substrate of first conduction type having a high impurities concentration, an epitaxial layer formed on a second surface of the substrate and having a higher resistance than the substrate of first conduction type, and a plurality of trenches formed in said epitaxial layer;
a drain electrode formed on a first surface of the substrate;
a source region of first conduction type formed on the semiconductor base along the second surface;
a plurality of trenches formed from the second surface of the semiconductor base;
a gate region of second conduction type formed along the trenches;
a source ohmic contact metal film in ohmic contact with the second surface of the source region; and
a source draw-out metal film in contact with the source ohmic contact metal film, and
a gate ohmic contact metal film having a bottom surface for ohmic contacting with the gate region on the bottom of the trenches,
said silicon carbide semiconductor device further comprising:
a gate rise metal film in contact with an upper surface of said gate ohmic contact metal film on the bottom of the trenches and rising to the second surface of the semiconductor base substrate to provide an upper surface of the gate rise metal film at said second surface of the semiconductor base substrate; and
a gate draw-out metal film connected to the gate rise metal film from the second surface of the semiconductor base substrate, wherein a portion of the gate draw-out metal film is formed on said upper surface of the gate rise metal film,
wherein said source draw-out metal film and said gate draw-out metal film are arranged on a same plane.

11. A silicon carbide semiconductor device according to claim 10,
wherein an insulating film is buried between the gate rise metal film and wall surfaces of the trenches.

12. A silicon carbide semiconductor device according to claim 10,
wherein an insulating film including a silicon oxide film is buried between the gate rise metal film and the wall surfaces of the trenches.

13. A silicon carbide semiconductor device according to claim 10,
wherein the rise metal film forms a silicide layer with the gate ohmic contact metal film on the bottom of the trenches.

14. A semiconductor device according to claim 10,
wherein the source electrode pad connected to the source draw-out metal film is arranged on the plane outside of the gate draw-out metal film.

15. A silicon carbide semiconductor device according to claim 10,
wherein a plurality of source draw-out metal films are arranged on the same plane, and the gate draw-out metal film is arranged between the plurality of the source draw-out metal films.

16. The semiconductor device according to claim 10, wherein the upper surface of the gate rise metal film is substantially level with the second surface of the semiconductor base substrate so that the upper surface of the gate rise metal film and the second surface of the semiconductor base substrate form a substantially flat surface.

17. The semiconductor device according to claim 10, wherein said portion of the gate draw-out metal film is in direct contact with the upper surface of the gate rise metal film.

18. The semiconductor device according to claim 16, wherein said portion of the gate draw-out metal film is in direct contact with the upper surface of the gate rise metal film.

19. A silicon carbide semiconductor device comprising a vertical field-effect transistor, said vertical field-effect transistor having:
a semiconductor base substrate having a bandgap of not less than 2.0 eV, which includes a silicon carbide substrate of first conduction type having a high impurities concentration in a semiconductor base, an epitaxial layer formed on a second surface of the substrate, and a plurality of trenches formed in said epitaxial layer;
a drain electrode formed on a first surface of the substrate;
a source region of first conduction type formed on the semiconductor base along the second surface;
a gate region of second conduction type formed along the trenches;
a source ohmic contact metal film in ohmic contact with the second surface of the source region; and
a source draw-out metal film in contact with the source ohmic contact metal film; and
a first gate ohmic contact metal film having a bottom surface for ohmic contacting with the gate region on the bottom of the trenches,
said silicon carbide semiconductor device further comprising:
a gate rise metal film in contact with an upper surface of said first gate ohmic contact metal film on the bottom of the trenches and rising to the second surface of the semiconductor base substrate to provide an upper surface of the gate rise metal film at said second surface of the semiconductor base substrate;
a second gate ohmic contact metal film in contact with the upper surface of the gate rise metal film at the second surface of the semiconductor base substrate; and a gate draw-out metal film connected to the second gate ohmic contact metal film, wherein a portion of the gate draw-out metal film is formed on an upper surface of said second gate ohmic contact metal film, wherein said source draw-out metal film and said gate draw-out metal film are arranged on a same plane.

20. A silicon carbide semiconductor device according to claim 19, wherein an insulating film including a silicon oxide film is buried between the gate rise metal film and wall surfaces of the trenches.

21. A silicon carbide semiconductor device according to claim 19, wherein the rise metal film forms a silicide layer with the first gate ohmic contact metal film on the bottom of the trenches.

22. A silicon carbide semiconductor device according to claim 19, wherein the source electrode pad is arranged on the plane outside of the gate ohmic contact metal film.

23. A silicon carbide semiconductor device according to claim 19, wherein a plurality of the source ohmic contact metal films are arranged on the same plane, and the second gate ohmic contact metal film is arranged between the plurality of the source ohmic contact metal films.

24. The semiconductor device according to claim 19, wherein the upper surface of the gate rise metal film is substantially level with the second surface of the semiconductor base substrate so that the upper surface of the gate rise metal film and the second surface of the semiconductor base substrate form a substantially flat surface.

25. The semiconductor device according to claim 19, wherein said portion of said gate draw-out metal film is in direct contact with the upper surface of the second gate ohmic contact metal film.

26. The semiconductor device according to claim 25, wherein said portion of said gate draw-out metal film is in direct contact with the upper surface of the second gate ohmic contact metal film.

* * * * *